(12) United States Patent
Schmitt et al.

(10) Patent No.: US 11,754,646 B2
(45) Date of Patent: Sep. 12, 2023

(54) MAGNETIC SENSOR SYSTEM

(71) Applicant: Analog Devices International Unlimited Company, Limerick (IE)

(72) Inventors: Jochen Schmitt, Biedenkopf (DE); Enno Lage, Kiel (DE); Michael Joseph Browne, Thurles (IE)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 17/688,439

(22) Filed: Mar. 7, 2022

(65) Prior Publication Data
US 2022/0308132 A1    Sep. 29, 2022

Related U.S. Application Data

(60) Provisional application No. 63/165,578, filed on Mar. 24, 2021.

(51) Int. Cl.
*G01R 33/09* (2006.01)
*G01R 33/07* (2006.01)

(52) U.S. Cl.
CPC ......... *G01R 33/091* (2013.01); *G01R 33/072* (2013.01); *G01R 33/093* (2013.01); *G01R 33/096* (2013.01); *G01R 33/098* (2013.01)

(58) Field of Classification Search
CPC combination set(s) only.
See application file for complete search history.

(56) References Cited

U.S. PATENT DOCUMENTS

| | | | |
|---|---|---|---|
| 8,134,361 B2 | 3/2012 | Azumi et al. | |
| 8,437,105 B2 | 5/2013 | Vas et al. | |

(Continued)

FOREIGN PATENT DOCUMENTS

| | | |
|---|---|---|
| DE | 102017104206 | 9/2017 |
| DE | 102009051978 | 3/2018 |

(Continued)

OTHER PUBLICATIONS

"German Application Serial No. 102020132914.8, Office Action dated Sep. 16, 2021", w/o English translation, 9 pgs.

(Continued)

*Primary Examiner* — Alvaro E Fortich
(74) *Attorney, Agent, or Firm* — Schwegman Lundberg & Woessner, P.A.

(57) ABSTRACT

The present disclosure provides magnetic sensor system that includes a magnetic sensor package comprising a magnetic single turn sensor and a magnetic multi-turn sensor, and a shield arrangement for shielding the magnetic sensor from stray magnetic fields. The shielding arrangement comprises a ferromagnetic tube that houses one or more magnets and connects to an end of rotating shaft, such that rotation of the shaft causes a corresponding rotation of the ferromagnetic tube and magnets. The magnetic sensor package is positioned on a surface of a PCB substrate, which is positioned in close proximity to the ferromagnetic tube and magnet arrangement. A shielding device is then arranged in close proximity to the magnetic sensor package, for example, on the opposite side of the PCB substrate or directly between the PCB substrate and the ferromagnetic tube, to provide additional shielding of any stray magnetic fields. The shielding device may be in the form of a disc or a ring of ferromagnetic material that has a higher level of magnetic conductivity.

20 Claims, 12 Drawing Sheets

(56) References Cited

U.S. PATENT DOCUMENTS

| | | |
|---|---|---|
| 8,461,829 B2 | 6/2013 | Steinich et al. |
| 9,885,762 B2 | 2/2018 | Kamada et al. |
| 9,927,262 B2 | 3/2018 | Bogos et al. |
| 10,612,944 B2 | 4/2020 | Hammerschmidt |
| 10,690,523 B2 | 6/2020 | Aichriedler et al. |
| 10,718,825 B2 | 7/2020 | Marauska et al. |
| 10,921,391 B2 | 2/2021 | Cadugan et al. |
| 10,950,377 B2 | 3/2021 | Ausserlechner |
| 2015/0070001 A1* | 3/2015 | Villaret .............. G01D 5/24476 324/207.2 |
| 2016/0033305 A1* | 2/2016 | Mehnert .............. G01D 5/2216 324/207.18 |
| 2017/0261345 A1 | 9/2017 | Schmitt |
| 2018/0216965 A1* | 8/2018 | Richard ................. G01R 33/09 |
| 2021/0231462 A1 | 7/2021 | Torii et al. |

FOREIGN PATENT DOCUMENTS

| | | | |
|---|---|---|---|
| EP | 3387387 B1 | 10/2019 | |
| EP | 3771916 A1 | 2/2021 | |

OTHER PUBLICATIONS

"United Kingdom Application Serial No. 2203985.3, Combined Search and Examination Report dated Sep. 15, 2022", 5 pgs.

Musha, Takeshi, "The basic examination of the magnetic shielding structure to use for a magnetic rotation angle sensor", Electron Comm Jpn. 102, Wiley Periodicals, Inc., (2019), 3-10.

* cited by examiner

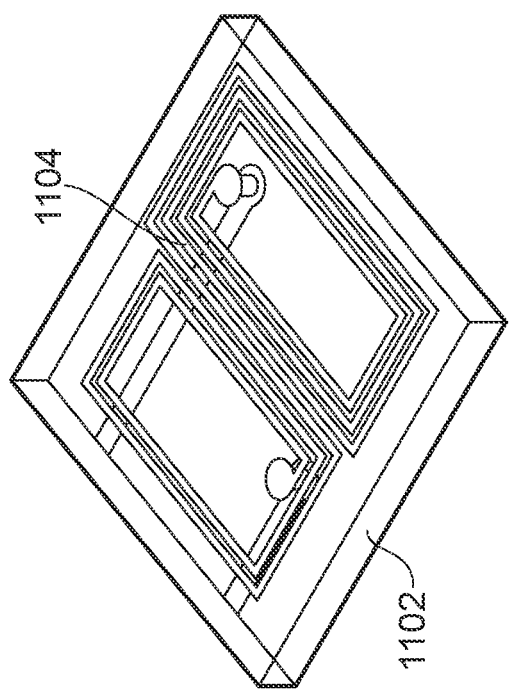
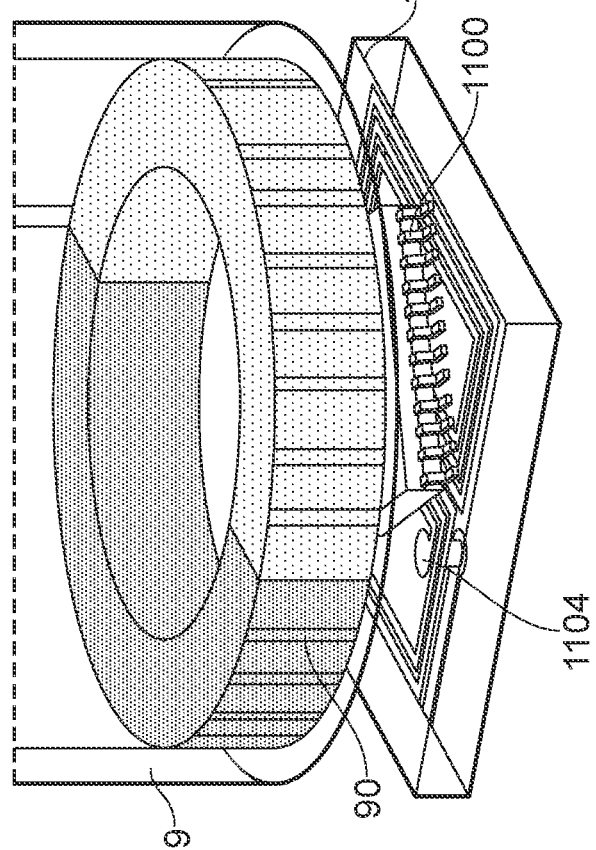
FIG. 11B
FIG. 11A

MAGNETIC SENSOR SYSTEM

FIELD OF INVENTION

The present disclosure relates to a magnetic sensor system. In particular, the present disclosure relates to a magnetic sensor system comprising a magnetic sensor and a shield arrangement for shielding the magnetic sensor from stray magnetic fields.

BACKGROUND

Magnetic single turn sensors and multi-turn sensors are commonly used in applications where there is a need to monitor both the number of times a device has been turned and its precise angular position. An example is a steering wheel in a vehicle. Magnetic multi-turn sensors and single turn sensors typically use magnetoresistive elements that are sensitive to an applied external magnetic field. The resistance of the magnetoresistive elements in multi-turn sensors can be changed by rotating a magnetic field within the vicinity of the sensor. Variations in the resistance of the magnetoresistive elements can be tracked to determine the number of turns in the magnetic field, which can be translated to a number of turns in the device being monitored. Similarly, variations in the resistance of the magnetoresistive elements in single turn sensors can be tracked to determine the magnetic field angle, which can be translated to the angular position of the device being monitored. The magnetoresistive elements in single-turn and multi-turn sensors are sensitive to changes in magnetic field strength and magnetic field angle, however, it is only changes in the magnetic field angle that are of interest for the purpose of monitoring the position and number of turns of a magnetic field, and variations in magnetic field strength due to stray magnetic fields from external sources can cause errors in the sensor readings.

SUMMARY

The present disclosure provides magnetic sensor system that includes a magnetic sensor package comprising a magnetic single turn sensor and a magnetic multi-turn sensor, and a shield arrangement for shielding the magnetic sensor from stray magnetic fields. The shielding arrangement comprises a ferromagnetic sleeve that houses one or more magnets, the sleeve either being an extension of the rotating shaft or a separate component that connects to an end of the rotating shaft, such that rotation of the shaft causes a corresponding rotation of the ferromagnetic sleeve and magnets. The magnetic sensor package is positioned on a surface of a PCB substrate, which is positioned in close proximity to the ferromagnetic tube and magnet arrangement. A shielding element is then arranged in close proximity to the magnetic sensor package, for example, on the opposite side of the PCB substrate or directly between the PCB substrate and the ferromagnetic sleeve, to provide additional shielding of any stray magnetic fields. The shielding element may be in the form of a disc or a ring of ferromagnetic material that has a higher level of magnetic conductivity than the magnetic sensor package.

A first aspect of the disclosure provides a magnetic sensor system, comprising, a magnetic sensing device mounted on a first surface of a substrate, the magnetic sensing device at least comprising a magnetic multi-turn sensor and a magnetic angle sensor; and a shielding arrangement configured to shield the magnetic sensing device from stray magnetic fields, the shielding arrangement comprising, a ferromagnetic sleeve extending from an end of a rotating shaft, the ferromagnetic sleeve being arranged to house one or more magnets therein, wherein the substrate is positioned a first distance from a first end of the ferromagnetic sleeve, such that the magnetic sensing device is aligned with a rotational axis of the ferromagnetic sleeve, and a shielding element arranged in proximity to the magnetic sensing device.

As such, a magnetic sensing device is placed at the end of a rotating shaft that has a ferromagnetic sleeve extending therefrom. One or more magnets are house within the ferromagnetic sleeve, the magnetic sensing device being configured to sense changes in the direction of the magnetic field generated by the magnet(s) as the rotating shaft rotates. A further shielding element is also providing in proximity to the magnetic sensing device, which combined with the ferromagnetic sleeve, protects the magnetic sensor device from stray magnetic fields that could produce errors in the measurements made by sensor, thus improving the reliability, accuracy and performance of the magnetic sensor device in environments where stray magnetic fields are present.

The shielding element may be a disc of ferromagnetic material arranged adjacent to a second surface of the substrate. That is to say, the shielding element is provided as a disc of ferromagnetic material adjacent to the opposite side of the substrate, such that the substrate is positioned in between the shielding element and the further magnetic sensor system. In doing so, the magnetic sensing device is shielded from above by the ferromagnetic sleeve, and from below by the shielding element, which provide a shielding effect as any stray magnetic fields will go be absorbed by the ferromagnetic material due to the higher magnetic conductivity.

In some arrangements, the shielding element may be a ring of ferromagnetic material arranged adjacent to a second surface of the substrate. In addition to the shielding benefits described above, the provision of a ring-shaped shielding element reduces eddy currents that are caused by the rotation of the magnets inside the ferromagnetic sleeve, particularly when the shaft is rotating at very high speeds.

The shielding element may comprise a flange extending from the first end of the ferromagnetic sleeve in a direction perpendicular to the rotational axis. For example, the flange may comprise a ring formed around the edge of the ferromagnetic sleeve adjacent, which extends in a direction parallel to the substrate. This flange further increases the range of the ferromagnetic material (having higher magnetic conductivity) around the magnetic sensing package, thus providing a higher shielding factor.

The shielding arrangement may further comprise a further shielding element arranged between the first surface of the substrate and the first end of the ferromagnetic sleeve such that the substrate is between the first shielding element and the further shielding element. For example, the further shielding element may comprise a ring of ferromagnetic material.

In some arrangements, the shielding element may comprise a further ferromagnetic sleeve arranged around the outside of the ferromagnetic sleeve. In doing so, two walls of ferromagnetic material are provided to shield from stray magnetic fields.

The ferromagnetic sleeve may have a cylindrical configuration. Alternatively, the ferromagnetic sleeve may have a square cross-section. Further, the ferromagnetic sleeve may have any configuration, but be formed of two segments.

The ferromagnetic sleeve may comprise a cylindrical body having a first through hole for housing the one or more magnets, and a second through hole for connecting to the rotating shaft. Moreover, the ferromagnetic sleeve may be an extension of the rotating shaft.

In some arrangement, the system further comprises the one or more magnets, wherein the one or more magnets may comprise a magnetic disc having a blind hole. Further, the one or more magnets may comprise a ring-shaped magnet, or the one or more magnets may comprise two segments that form a ring shape.

The substrate may further comprise at least one electrical conductor embedded within the substrate, wherein the conductor is configured to generate a magnetic field when a current pulse is applied thereto, such that domain walls are generated in a plurality of magnetoresistive elements in the magnetic multi-turn sensor. As such, by applying a strong current pulse to a conductor embedded in the substrate, a strong magnetic field may be generated to initialize the multi-turn sensor into a known magnetic state.

In any of the examples described herein, the magnetic multi-turn sensor may be a giant magnetoresistive (GMR) or tunnel magnetoresistive (TMR) based multi-turn sensor. Further, the magnetic angle sensor may be an anisotropy magnetoresistive (AMR) based angle sensor or a Hall-based angle sensor.

The magnetic sensing device may be a magnetic sensor package comprising a housing and a package substrate, wherein the magnetic multi-turn sensor and the magnetic angle sensor are mounted onto the package substrate.

BRIEF DESCRIPTION OF THE DRAWINGS

The present disclosure will now be described by way of example only with reference to the accompanying drawings in which:

FIGS. 11A-B is an example of an initialisation device used with a magnetic sensor system in accordance with embodiments of the disclosure;

DETAILED DESCRIPTION

Magnetic multi-turn and single turn sensors can be used to monitor the turn count and angular position of a rotating shaft. Such magnetic sensing can be applied to a variety of different applications, such as automotive applications, medical applications, industrial control applications, consumer applications, and a host of other applications which require information regarding a position of a rotating component.

The present disclosure provides a magnetic sensor comprising a magnetic single turn (ST) sensor and a magnetic multi-turn (MT) sensor packaged together on a single lead frame, and a shield arrangement around the sensor package and magnet to ensure the sensor package, and in particular the ST sensor, is not disturbed by stray magnetic fields. In typical uses, there may be many sources of stray fields like motor windings, relays, current bus bars or similar, which can affect the accuracy of the signal output by the magnetic sensor.

Figure 1:
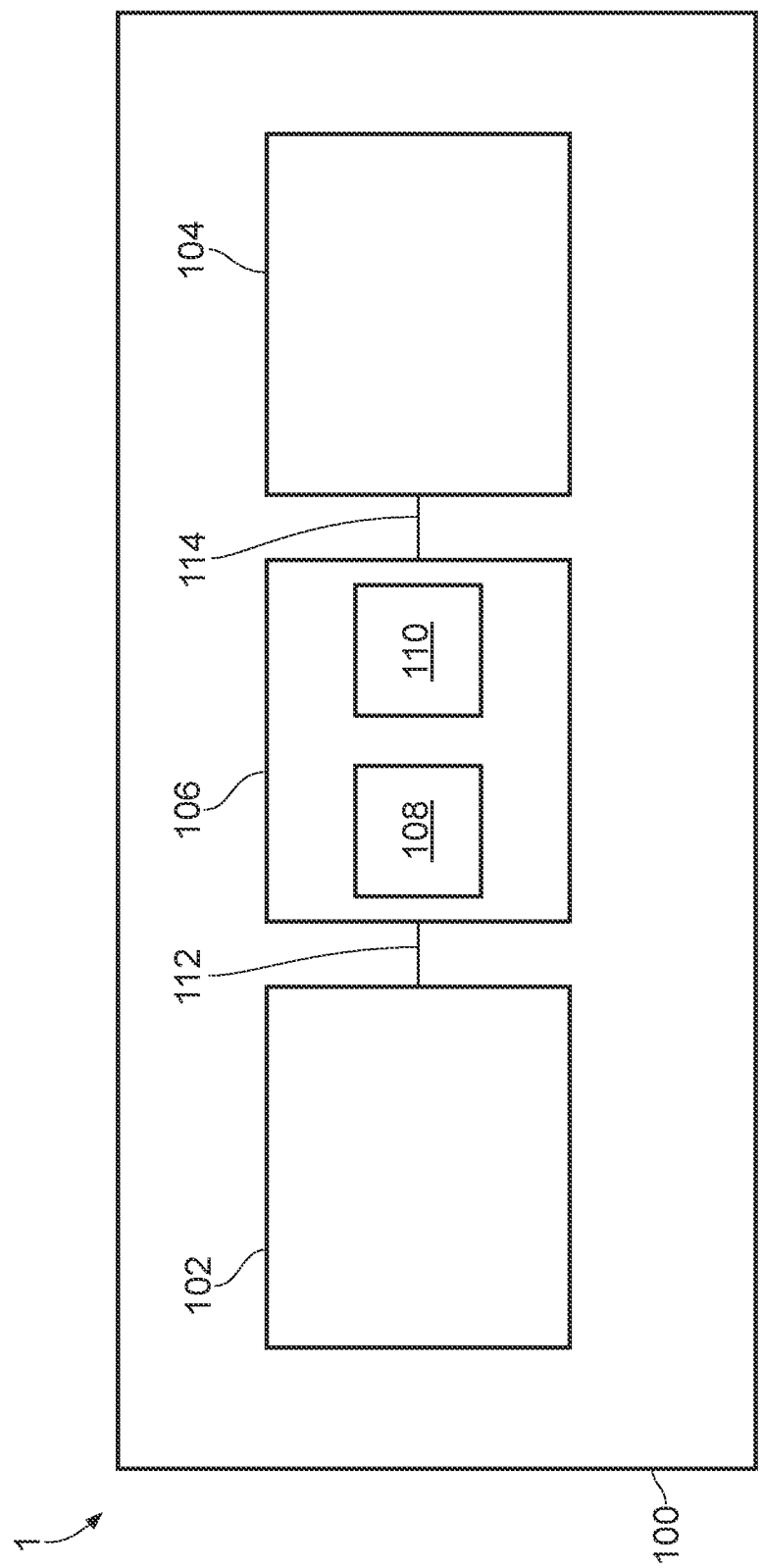
FIG. 1 is an example of a magnetic sensor package in accordance with embodiments of the disclosure.

FIG. 1 illustrates a schematic block diagram of an example magnetic sensing device 1, which may be used in any of the examples described below. The magnetic sensing device 1 includes an xMR multi-turn (MT) sensor 102 and an xMR magnetic single turn (ST) sensor 104, The MT sensor 102 may be giant magnetoresistive (GMR) or tunnel magnetoresistive (TMR) based turn sensor, and the ST sensor 104 may be an anisotropic magnetoresistive (AMR), giant magnetoresistive (GMR) or tunnel magnetoresistive (TMR) based position sensor. Likewise, the ST sensor 104 may be a Hall-based angle sensor.

The sensing device 1 also comprises a processing circuit 106, and an integrated circuit 100 on which the MT sensor 102, the ST sensor 104 and processing circuit 106 are disposed. The processing circuit 106 receives signals $S_{MT}$ 112 from the MT sensor 102 and processes the received signals to determine that the turn count using a turn count decoder 108, which will output a turn count representative of the number of turns of an external magnetic field (not shown) rotating in the vicinity of the MT sensor 102, Similarly, the processing circuit 106 may also receive signals SsT 114 from the ST sensor 104 and process the received signals using a position decoder 110 to output an angular position of the external magnetic field.

Figure 2:
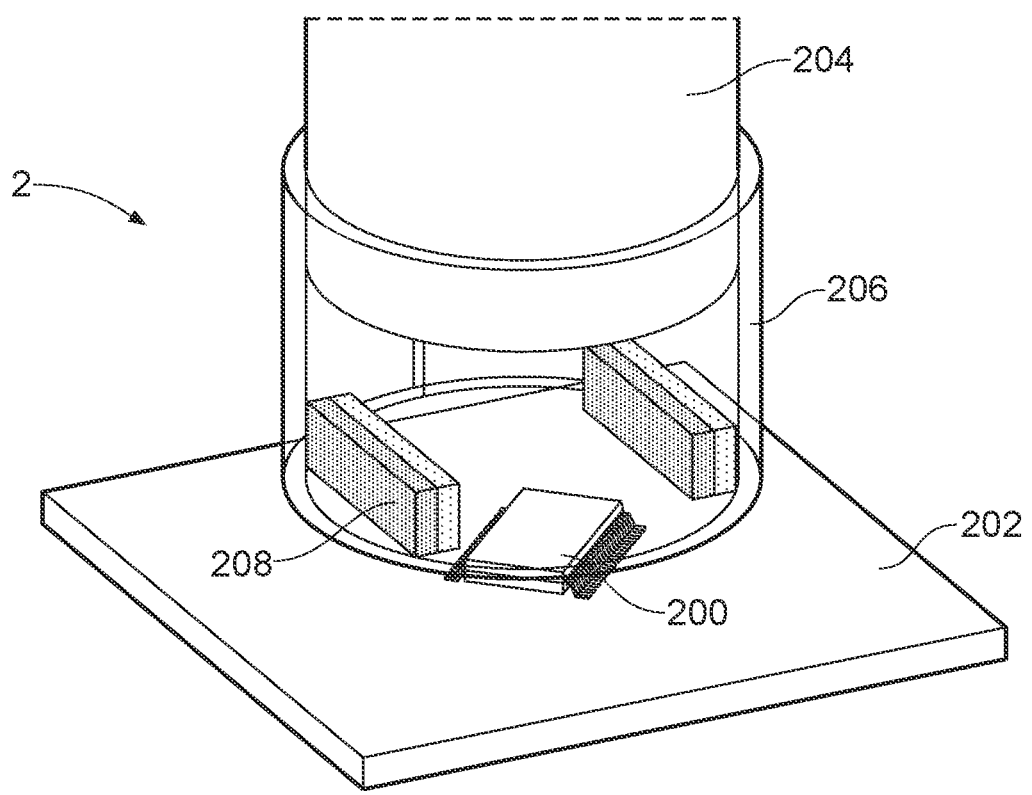
FIG. 2 is an example of a magnetic sensor system in accordance with embodiments of the disclosure.

FIG. 2 illustrates a first example of a magnetic sensing system 2 according to the present disclosure. A magnetic sensor package 200 is mounted on a surface of a substrate 202, for example, a printed circuit board (PCB), positioned below a rotating shaft 204. The magnetic sensor package 200 may comprise the magnetic sensing device 1 shown in FIG. 1. The shaft 204 may be connected to any rotating system where it is necessary to monitor the rotation, for example, a steering wheel. A soft ferromagnetic sleeve 206 having a substantially cylindrical configuration is connected to the shaft 204, and a pair of magnets 208 are positioned inside the ferromagnetic sleeve 206 to rotate with the shaft 204 and the sleeve 206. Whilst a pair of magnets 208 are shown here, it will be appreciated that a number of different suitable and advantageous magnet configurations may be used, as will be described in more detail below.

Here the magnetic sensor package 200 is positioned so that it is slightly below the sleeve 206, however, it will be appreciated that the sensor package 200 may be arranged such that it sits inside the sleeve 206. As the magnetic sensor package 200 comprises a ST sensor, the magnetic sensor package 200 is positioned such that the ST sensor is aligned with the axis of rotation so that the ST sensor is placed in a position where the magnetic field is the most homogenous, to achieve the best angular position performance. The ferromagnetic sleeve 206 provides a shielding effect from stray magnetic fields, as these will go through the sleeve 206 due to the higher magnetic conductivity.

Figure 3:
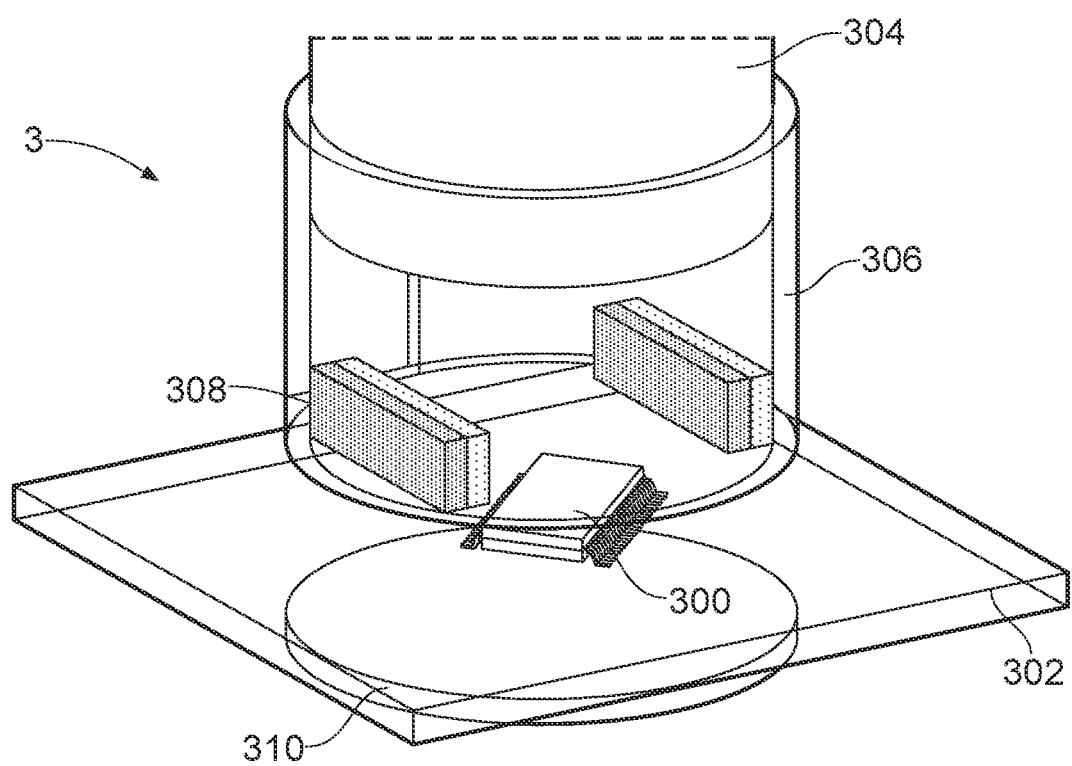
FIG. 3 is another example of a magnetic sensor system in accordance with embodiments of the disclosure.

FIG. 3 illustrates a further example of a magnetic sensing system 3 according to the present disclosure. As before, a magnetic sensor package 300 is mounted on a surface of a substrate 302 positioned below a rotating shaft 304, with a soft ferromagnetic sleeve 306 connected to the shaft 304, and a pair of magnets 308 positioned inside the sleeve 306, In this example, an additional disk-shaped ferromagnetic shield 310 is provided below the substrate 302, The disk-shaped ferromagnetic shield 310 may be mounted directly onto the lower surface of the substrate 302 or a small distance below to allow surface mounted electronic parts to be placed on the substrate 302, As such, the disk-shaped ferromagnetic shield 310 provides further shielding to the magnetic sensor package 300 from below, whereby stray magnetic fields are absorbed by the ferromagnetic material. The provision of the ferromagnetic sleeve 306 and a further ferromagnetic shield 310 therefore provides an improved shielding effect, thus further improving the reliability and accuracy of the magnetic sensor package 300 in environments where there are high levels of stray magnetic fields.

Figure 4:
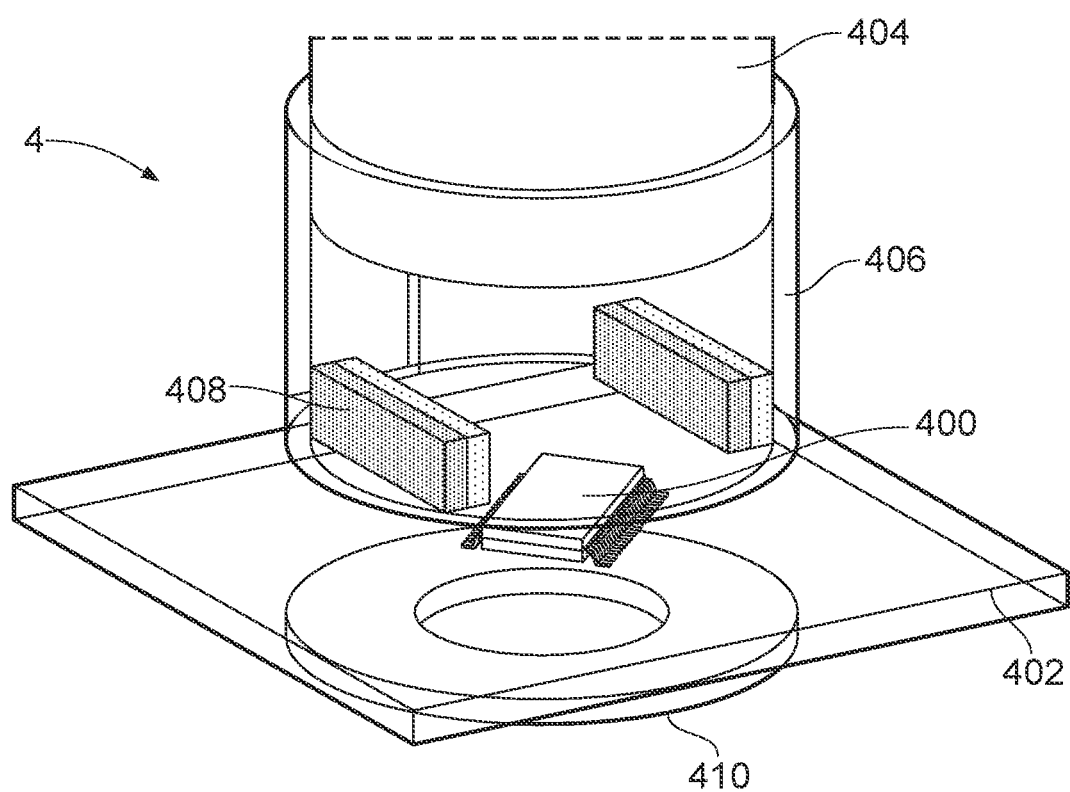
FIG. 4 is a further example of a magnetic sensor system in accordance with embodiments of the disclosure.

FIG. 4 illustrates another example of a magnetic sensing system 4 that is similar to that of FIG. 3. As before, a magnetic sensor package 400 is mounted on a surface of a substrate 402 positioned below a rotating shaft 404, but in this example, a washer or ring-shaped ferromagnetic shield 410 is provided below the substrate 302. By providing the ferromagnetic shield 410 with a through hole, eddy currents that are caused by the rotation of the magnets 408 inside the sleeve 406 can be greatly reduced. In this respect, eddy currents will be generated by the change in magnetic flux going through the ferromagnetic shield 410 as the speed at which the magnets 408 are rotating changes. This is because magnetic flux change in a conductive material will cause eddy currents to occur. Those eddy currents themselves generate a magnetic field that is opposite to the magnetic field causing the eddy currents (with a small phase shift). As such, the ferromagnetic shield 410 will generate a magnetic field due to the eddy currents that is opposite to the magnetic field generated by the magnets 408, which results in a reduction of the working magnetic field. By providing a hole in the ferromagnetic shield 410, this reduces the area where the eddy currents can flow and with this the counter effect on the magnetic field generated by the magnets 408 is also reduced, Such an arrangement may therefore be particularly advantageous in systems where the rotating shaft 404 is rotating at very high speeds, thus experiencing a higher level of eddy currents.

It will be appreciated that the shields 310, 410 shown in FIGS. 3 and 4 may have a different shape or configuration. However, an improved shielding effect can be achieved from shapes whereby the shield can be placed below sensor package in such a way that they extend outwards from the sensor package in a symmetrical configuration, which can be achieved more readily with shields having a circular configuration.

Figure 5:
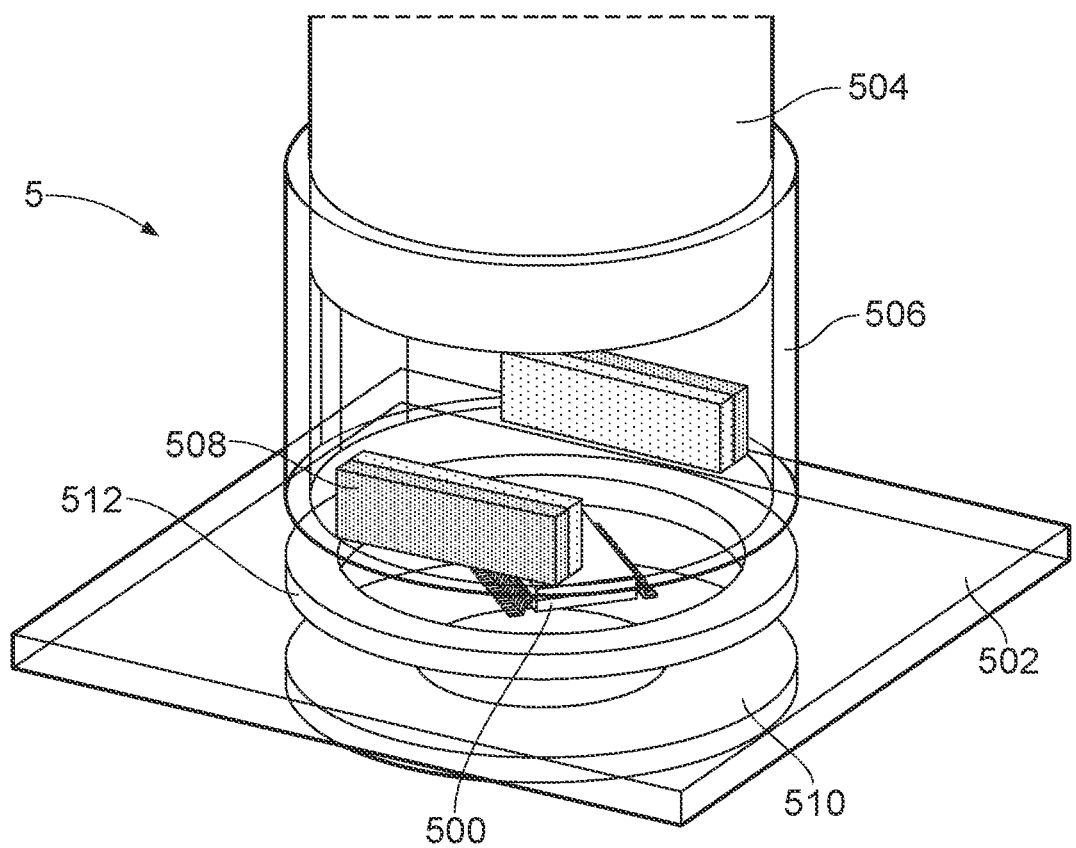
FIG. 5 is a further example of a magnetic sensor system in accordance with embodiments of the disclosure.

FIG. 5 illustrates a further example of a magnetic sensing system 5 that is similar to that of FIG. 4. As before, a magnetic sensor package 500 is mounted on a surface of a substrate 502 positioned below a rotating shaft 504, with a soft ferromagnetic sleeve 506 connected to the shaft 504, and a pair of magnets 508 positioned inside the sleeve 506. The magnetic sensor package also has the washer or ring-shaped ferromagnetic shield 510 below the substrate 502, as in previous FIG. 4, But FIG. 5 includes an additional ring-shaped ferromagnetic shield 512 positioned above the substrate 502 such that it encircles the magnet sensor package 500. Again, the ferromagnetic shield 512 may be mounted directly on the upper surface of the substrate 502 or a small distance above.

Figure 6:
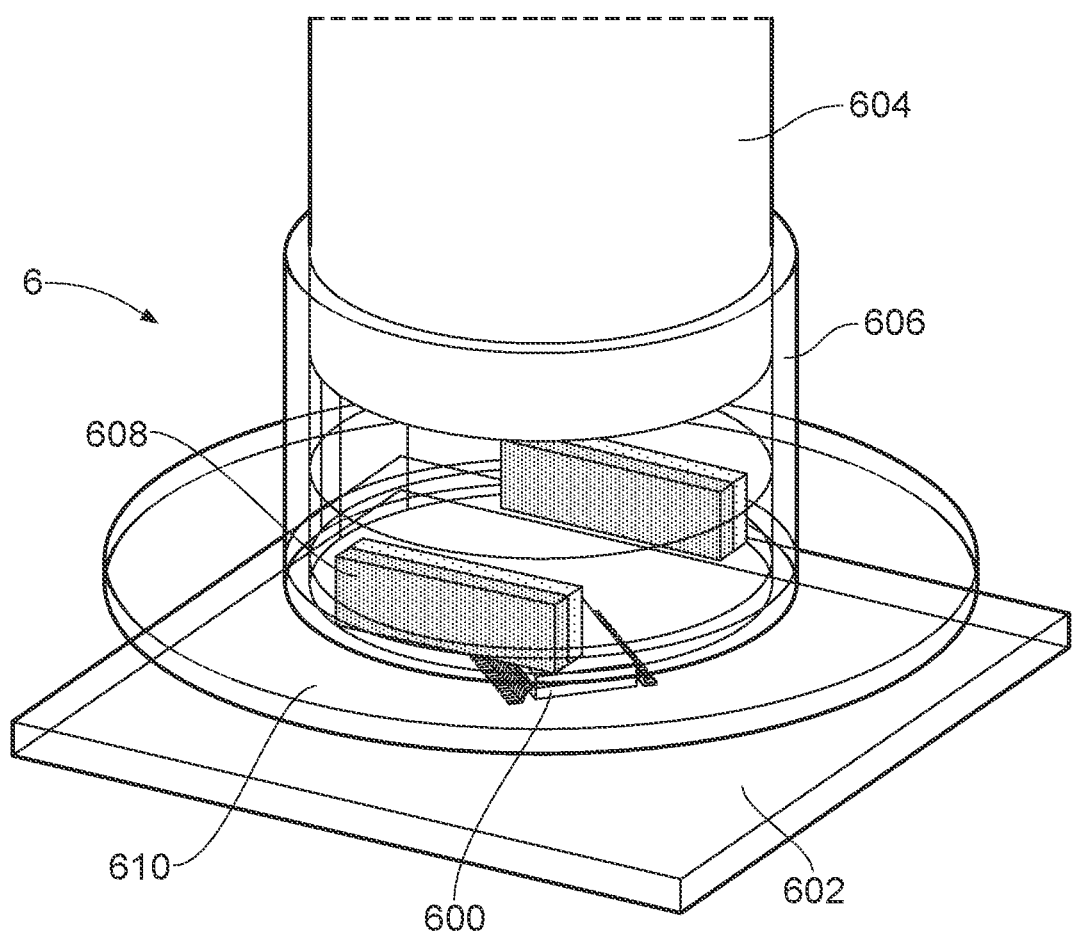
FIG. 6 is a further example of a magnetic sensor system in accordance with embodiments of the disclosure.

FIG. 6 illustrates another example of magnetic sensing system 6 that is similar to that of FIG. 1 in which a magnetic sensor package 600 is mounted on a surface of a substrate 602 positioned below a rotating shaft 604, however, in this example the ferromagnetic sleeve 606 which has a pair of magnets 608 positioned inside, comprises a flange 610 that extends from the bottom of the sleeve 606 in a direction that is perpendicular to the rotational axis. The effect of this flange 610 is to increase the surface area of the ferromagnetic material that surrounds the sensor package 600, and thus increase the range of the higher magnetic conductivity material, to provide a higher shielding factor.

Figure 7:
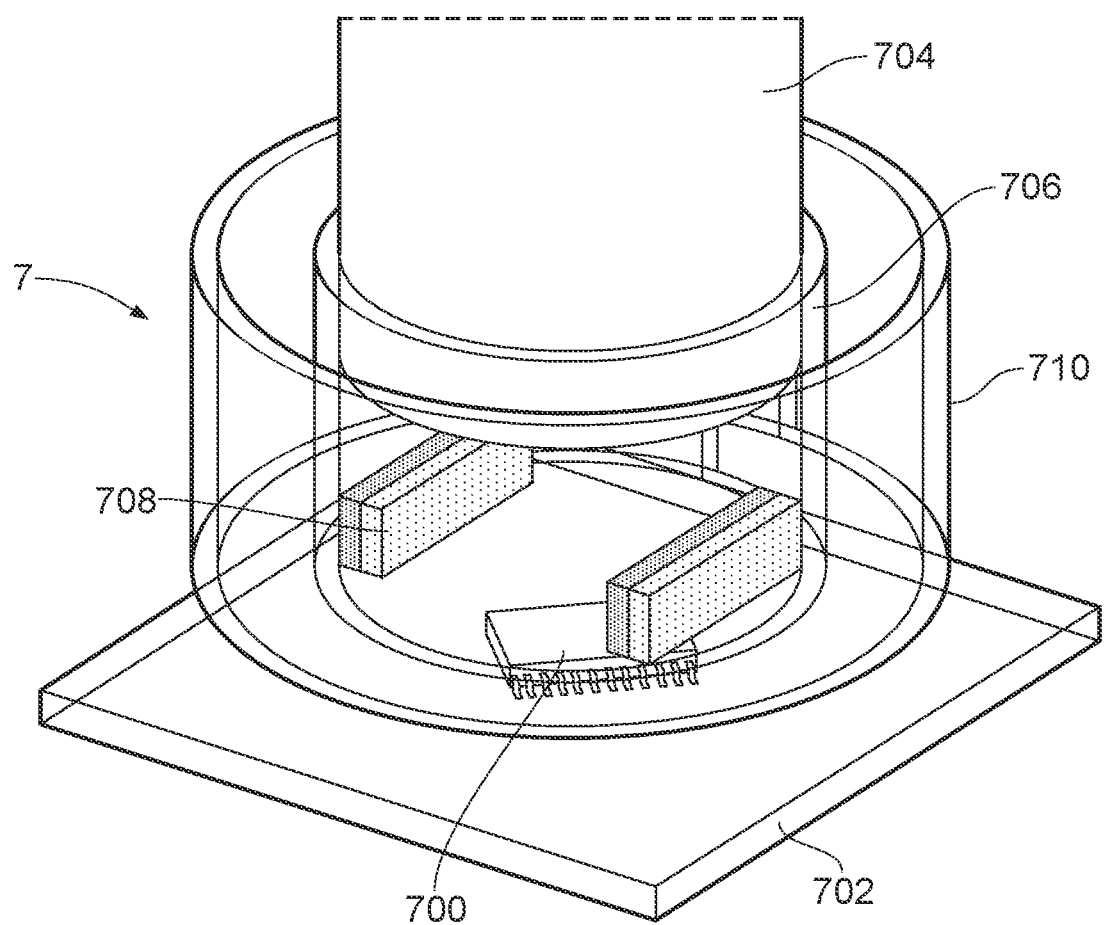
FIG. 7 is a further example of a magnetic sensor system in accordance with embodiments of the disclosure.

FIG. 7 illustrates another example of magnetic sensing system 7 that is similar to that of FIG. 1, in which a magnetic sensor package 700 is mounted on a surface of a substrate 702 positioned below a rotating shaft 704, however, in this example a second ferromagnetic sleeve 710 of larger diameter is placed around the outside of the first ferromagnetic sleeve 706 containing the pair of magnets 708 inside. As such, any stray fields have two walls of ferromagnetic material to pass through, thereby increasing the shielding factor.

Figure 8:
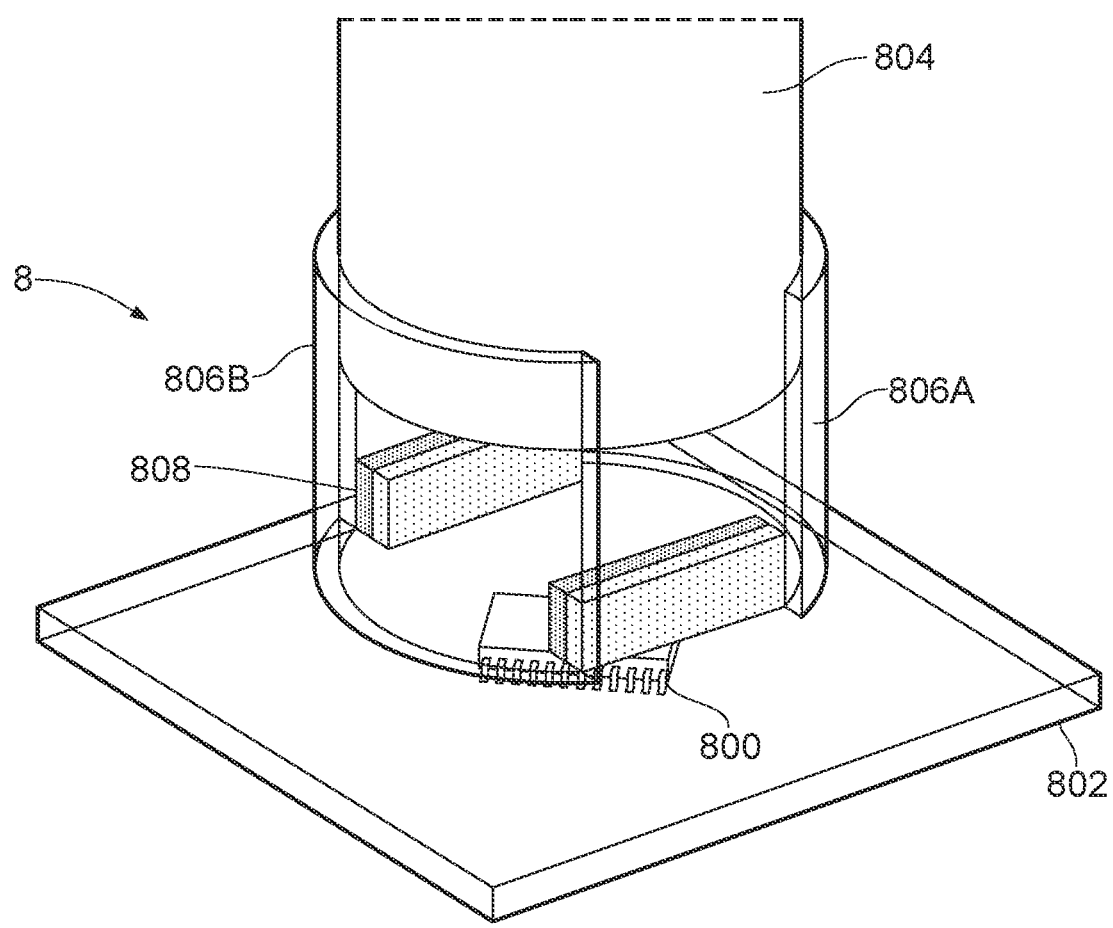
FIG. 8 is a further example of a magnetic sensor system in accordance with embodiments of the disclosure.

The precision of the single turn sensor is mainly affected by stray fields that are pointing perpendicular to the magnetic field generated by the magnet. As such, the shield may only need to be configured to shield from stray fields in that direction. FIG. 8 illustrates a magnetic sensing system 8, wherein the ferromagnetic sleeve shield is divided into two portions 806A, 806B that are arranged on opposite sides of the shaft and perpendicular to the magnets 808. As such. the magnetic sensor package 800 which is mounted on a surface of a substrate 802 positioned below a rotating shaft 804, is only shielded from stray fields that are perpendicular to the magnets 808.

FIGS. 9A-C and 10A-C illustrate further magnet geometries that may be used with any of the above examples.

Figure 9A:
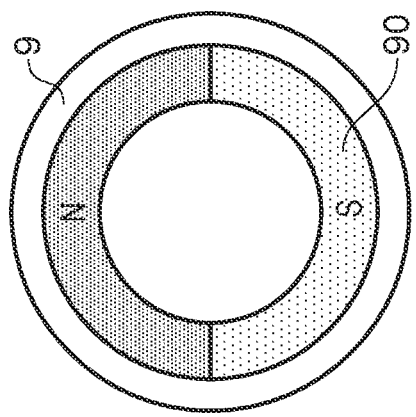
FIGS. 9A-C illustrate examples of a magnet used in accordance with embodiments of the disclosure.
Figure 9B:
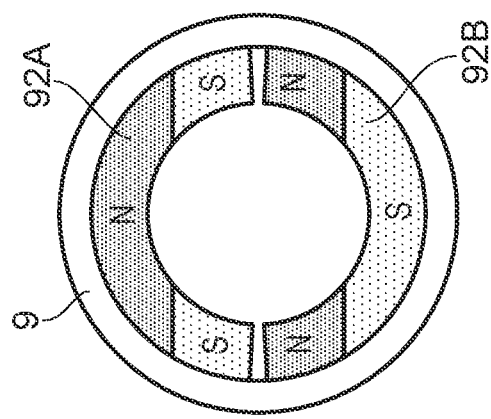
Figure 9C:
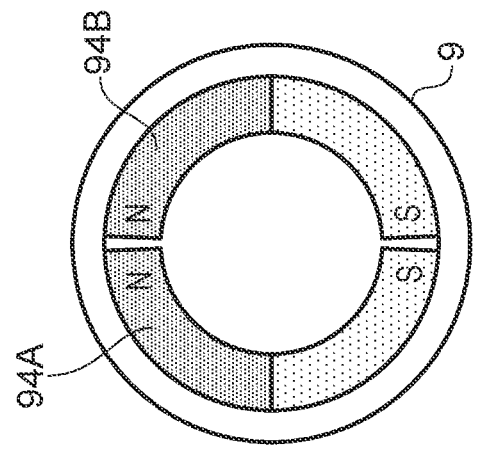

As shown in FIG. 9A, a ring shaped magnet 90 may be housed inside the ferromagnetic shield sleeve 9, Such an arrangement provides a very homogenous magnetic field, which is particularly important for ensuring the sensor outputs of the magnetic sensor are accurate. The magnetoresistive elements in the ST and MT sensor are sensitive to changes in magnetic field strength and magnetic field angle, however, it is only changes in the magnetic field angle that are of interest for the purpose of monitoring the position and number of turns of a magnetic field, and variations in magnetic field strength can cause errors in the sensor readings. As such, in addition to shield from stray fields that could affect the field strength, it is important that the magnets used to provide a homogenous magnetic field in the plane of the magnetic sensor package. In other arrangements, such as that shown in FIG. 9B, two magnetic segments 92A-B may be provided, whereby each magnetic segment 92A, 92B has a "C" shaped configuration. Likewise, FIG. 9C shows a similar arrangement whereby two "C" shaped magnetic segments 94A-B are provided. In the example of FIGS. 9B and 9C, any suitable configuration of the magnetic poles may be used, provided that a substantially homogenous magnetic field is generated.

Figure 10C:
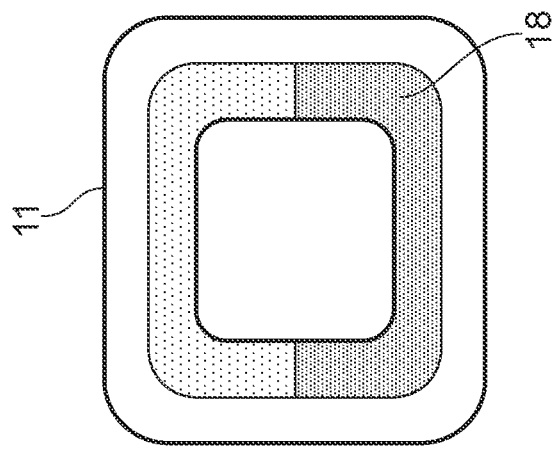
FIGS. 10A-C illustrate further examples of a magnet used in accordance with embodiments of the disclosure.
Figure 10B:
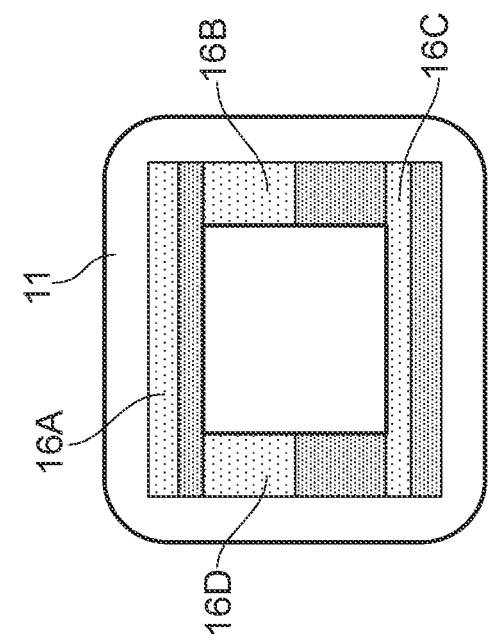
Figure 10A:
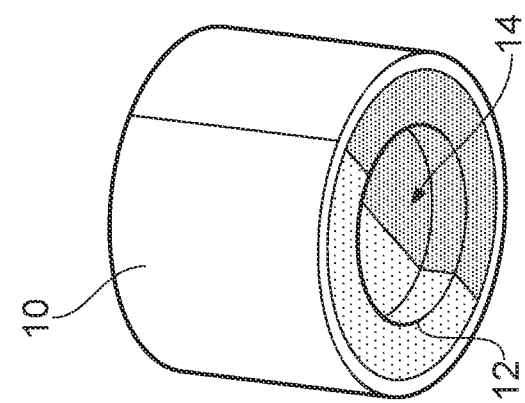

In FIG. 10A, a ferromagnetic shield sleeve 10 is again provided, in which a disc shaped magnet 12 with a blind hole 14 is provided. Even in circular magnets, an inhomogeneous magnetic field will surround the homogeneous field. In this example, the disc portion inside the blind hole 14 generates an inhomogeneous magnetic field that counters the inhomogeneous magnetic field of the ring portion surrounding the blind hole 14, thereby providing a more homogeneous resulting magnetic field. Such an arrangement is also more rigid and robust than the ring shaped magnet arrangements described above.

Whilst a circular ferromagnetic sleeve and magnet provide better homogeneity, it will be appreciated that other suitable shapes may be used provided they are symmetrical. For example, in FIGS. 10B and 10C, a square shaped ferromagnetic shield sleeve 11 is used. The sleeve 11 may then house multiple magnet segments 16A-16D, as shown in FIG. 10B, or a single magnet 18, as shown in FIG. 10C.

The examples described herein may also be provided with means for initialising the magnetic MT sensor house within the sensor package. An example is shown in FIGS. 11A-B. Here the sleeve 9 and magnet 90 arrangement shown in FIG. 9A, although it will be appreciated that any of those described with reference to FIGS. 9A-C and 10A-C may be used, is placed above a magnetic sensor package 1100 mounted on a substrate 1102, for example, a printed circuit board (PCB), in which a wire 1104 is embedded.

To initialise the MT sensor of the magnetic sensor package 1100, a magnetic field pulse is generated by applying a strong current pulse to the wire 1104. The magnetic field generated by wire 1104, plus any magnetic field already being generated by the magnet 90, results in a magnetic field that is stronger than the upper limit of the operating window of the MT sensor. For example, a 10 microsecond pulse of approximately 50A will result in a 25 mT magnetic field. This results in the magnetoresistive elements of the MT sensor being nucleated with domain walls, thereby magnetising all of the magnetoresistive elements into a known magnetic state. The magnetic field generated is stronger nearer the wire itself 1104, and so it is important to arrange the wire 1104 and the magnetic sensor package 1100 in close proximity, for example, with the magnetic sensor package 1100 mounted directly above the highest concentration of wire 1104. Whilst the wire 1104 is arranged in planar coil configuration comprising two spirals, it will of course be appreciated that the wire 1104 may be arranged any suitable configuration provided the magnetic sensor package 1100 is positioned adjacent to at least a portion of the wire 1104.

Figure 12:
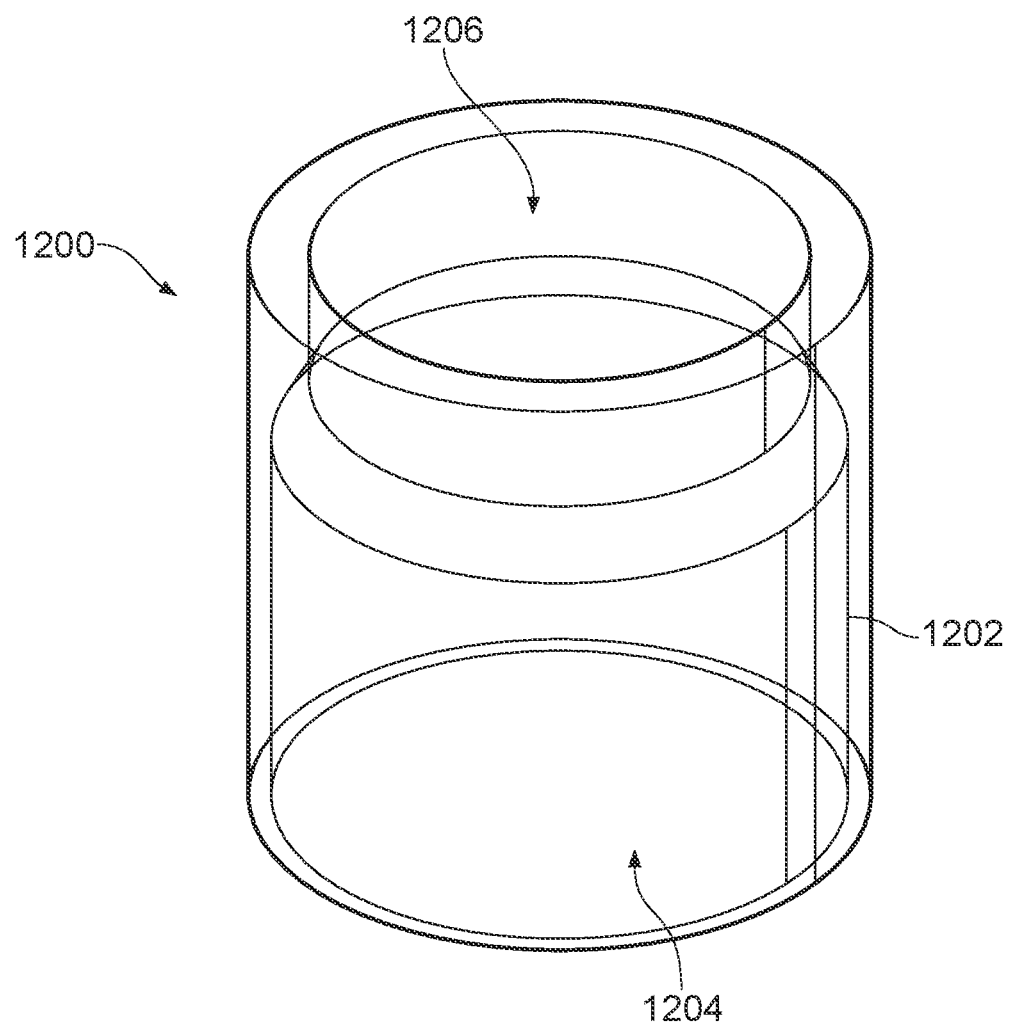
FIG. 12 is an example of a part of the shielding arrangement in accordance with embodiments of the disclosure.

Whilst the examples described above show a substantially cylindrical ferromagnetic sleeve that is connected to a rotating shaft, it will be appreciated that the configuration of the ferromagnetic sleeve may vary. For example, as shown in FIG. 12, the ferromagnetic sleeve 1200 comprise a cylinder 1202 with a first blind hole 1204 in which the magnet(s) is housed, and a second blind hole 1206 for connecting to the shaft, the second blind hole 1206 having a smaller diameter to that of the first blind hole 1204.

Alternatively, the ferromagnetic sleeve may be provided as an extension of the rotating shaft itself, provided the shaft is formed from a ferromagnetic material, wherein the magnet is mounted within an axial drilled hole in the end of the shaft.

It will be appreciated that various components shown in FIGS. 2-8, and 11-12, such as the substrate, ferromagnetic sleeve and shielding element(s), are depicted as transparent for exemplar reasons, to improve the view of other aspects of the embodiment.

Various modifications, whether by way of addition, deletion and/or substitution, may be made to all of the above described embodiments to provide further embodiments, any and/or all of which are intended to be encompassed by the appended claims.

For example, the shaft, magnet and ferromagnetic sleeve may have features such as a key, pin or some other locking mechanism, to prevent the magnet and/or sleeve from twisting relative to the rotating shaft. This ensures that the rotation of the magnet directly corresponds with the rotation of the shaft.

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for shielding stray magnetic fields from a magnetic sensor system comprising a magnetic sensor.

Aspects of this disclosure can be implemented in various electronic devices or systems. For instance, phase correction methods and sensors implemented in accordance with any of the principles and advantages discussed herein can be included in various electronic devices and/or in various applications, Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

The invention claimed is:

1. A magnetic sensor system, comprising:
a magnetic sensing device mounted on a first surface of a substrate, the magnetic sensing device at least comprising a magnetic multi-turn sensor and a magnetic angle sensor; and
a shielding arrangement configured to shield the magnetic sensing device from stray magnetic fields, the shielding arrangement comprising:
a ferromagnetic sleeve extending from an end of a rotating shaft, the ferromagnetic sleeve defining a receptacle sized to receive and seat against the rotating shaft, the ferromagnetic sleeve being arranged to house one or more magnets therein, wherein the substrate is positioned a first distance from a first end of the ferromagnetic sleeve, such that the magnetic sensing device is aligned with a rotational axis of the ferromagnetic sleeve; and
a shielding element arranged in proximity to the magnetic sensing device.

2. A magnetic sensor system according to claim 1, wherein the shielding element is a disc of ferromagnetic material arranged adjacent to a second surface of the substrate.

3. A magnetic sensor system according to claim 1, wherein the shielding element is a ring of ferromagnetic material arranged adjacent to a second surface of the substrate.

4. A magnetic sensor system according to claim 1, wherein the shielding element is mounted to the second surface of the substrate.

5. A magnetic sensor system according to claim 1, wherein the shielding element comprises a flange extending from the first end of the ferromagnetic sleeve in a direction perpendicular to the rotational axis.

6. A magnetic sensor system according to claim 1, wherein the shielding arrangement further comprises a further shielding element arranged between the first surface of the substrate and the first end of the ferromagnetic sleeve.

7. A magnetic sensor system according to claim 6, wherein the further shielding element comprises a ring of ferromagnetic material.

8. A magnetic sensor system according to claim 1, wherein the shielding element comprises a further ferromagnetic sleeve arranged around the outside of the ferromagnetic sleeve.

9. A magnetic sensor system according to claim 1, wherein the ferromagnetic sleeve has a cylindrical configuration or a square cross-section.

10. A magnetic sensor system according to claim 1, wherein the ferromagnetic sleeve is formed of two segments.

11. A magnetic sensor system according to claim 1, wherein the ferromagnetic sleeve comprises a cylindrical body having a first through hole for housing the one or more magnets, and a second through hole for connecting to the rotating shaft.

12. A magnetic sensor system according to claim 1, wherein the ferromagnetic sleeve is an extension of the rotating shaft.

13. A magnetic sensor system according to claim 1, further comprising the one or more magnets.

14. A magnetic sensor system according to claim 13, wherein the one or more magnets comprise a magnetic disc having a blind hole.

15. A magnetic sensor system according to claim 13, wherein the one or more magnets comprise a ring-shaped magnet.

16. A magnetic sensor system according to claim 13, wherein the one or more magnets comprise two segments that form a ring shape.

17. A magnetic sensor system according to claim 1, wherein the substrate further comprises at least one electrical conductor embedded within the substrate, wherein the conductor is configured to generate a magnetic field when a current pulse is applied thereto, such that domain walls are generated in a plurality of magnetoresistive elements in the magnetic multi-turn sensor.

18. A magnetic sensor system according to claim 1, wherein the magnetic multi-turn sensor is a giant magnetoresistive (GMR) or tunnel magnetoresistive (TMR) based multi-turn sensor.

19. A magnetic sensor system according to claim 1, wherein the magnetic angle sensor is an anisotropy magnetoresistive (AMR) based angle sensor or a Hall-based angle sensor.

20. A magnetic sensor system according to claim 1, wherein the magnetic sensing device is a magnetic sensor package comprising a housing and a package substrate, wherein the magnetic multi-turn sensor and the magnetic angle sensor are mounted onto the package substrate.

* * * * *